(12) United States Patent
Huang et al.

(10) Patent No.: US 11,644,491 B2
(45) Date of Patent: May 9, 2023

(54) SIGNAL ADJUSTMENT DEVICE AND SIGNAL ADJUSTMENT METHOD

(71) Applicant: REALTEK SEMICONDUCTOR CORPORATION, Hsinchu (TW)

(72) Inventors: Ming-Chung Huang, Hsinchu (TW); I-Hua Tseng, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 68 days.

(21) Appl. No.: 17/239,906

(22) Filed: Apr. 26, 2021

(65) Prior Publication Data
US 2021/0389355 A1 Dec. 16, 2021

(30) Foreign Application Priority Data
Jun. 16, 2020 (TW) ................................ 109120279

(51) Int. Cl.
| | | |
|---|---|---|
| *G01R 21/133* | (2006.01) | |
| *G01R 21/127* | (2006.01) | |
| *G01R 21/00* | (2006.01) | |

(52) U.S. Cl.
CPC ......... *G01R 21/133* (2013.01); *G01R 21/006* (2013.01); *G01R 21/127* (2013.01)

(58) Field of Classification Search
CPC ... G01R 21/133; G01R 21/006; G01R 21/127
See application file for complete search history.

(56) References Cited

U.S. PATENT DOCUMENTS

| | | | | |
|---|---|---|---|---|
| 2004/0116083 A1* | 6/2004 | Suzuki | .................. | H03F 1/3258 |
| | | | | 330/149 |
| 2014/0140522 A1* | 5/2014 | Deng | ....................... | H04R 3/08 |
| | | | | 381/59 |
| 2015/0042407 A1* | 2/2015 | Huang | .................... | H03L 7/185 |
| | | | | 331/18 |

OTHER PUBLICATIONS

K. Wakabayashi et al., "Low-Distortion Single-Tone and Two-Tone Sinewave Generation Algorithms Using an Arbitrary Waveform Generator," 2011 IEEE 17th International Mixed-Signals, Sensors and Systems Test Workshop, Santa Barbara, CA, USA, 2011, pp. 33-38, doi: 10.1109/IMS3TW.2011.17.
K. Kato, F. Abe, K. Wakabayashi, T. Yamada, H. Kobayashi, O. Kobayashi, K. Niitsu "Low-IMD Two-Tone Signal Generation for ADC Testing", IEEE 18th International Mixed-Signals, Sensors, and Systems Test Workshop, Taipei, Taiwan (May 2012).

* cited by examiner

*Primary Examiner* — Natalie Huls
*Assistant Examiner* — Sharad Timilsina
(74) *Attorney, Agent, or Firm* — WPAT, PC

(57) ABSTRACT

A signal adjustment device includes a frequency adjustment circuit, a filter circuit, and a power estimation circuit. The frequency adjustment circuit is configured to receive a two-tone signal from a signal generator and to generate a first signal according to the two-tone signal, wherein the signal generator generates the two-tone signal according to a first coefficient and a second coefficient. The filter circuit is configured to filter the first signal, in order to generate a second signal. The power estimation circuit is configured to detect a power of an intermodulation distortion from the third order signal component, which is associated with the two-tone signal, in the second signal, and to adjust at least one of the first coefficient and the second coefficient according to the power, in order to reduce the power.

20 Claims, 3 Drawing Sheets

SIGNAL ADJUSTMENT DEVICE AND SIGNAL ADJUSTMENT METHOD

BACKGROUND

1. Technical Field

The present disclosure relates to a signal adjustment device. More particularly, the present disclosure relates to a signal adjustment device for calibrating linearity of a signal generator and a signal adjustment method.

2. Description of Related Art

In order to acquire a testing result having higher credibility, the specification of testing equipment is usually required to be higher than that of a circuit under test. However, with the development of technology, the specification of an integrated circuit is getting higher, and thus existing testing equipment is insufficient to test the integrated circuit. In order to test operations of the integrated circuit properly, the existing testing equipment is required to be replaced by testing equipment having higher performance. As a result, cost of testing integrated circuit will be significantly increased.

SUMMARY

In some embodiments, a signal adjustment device includes a frequency adjustment circuit, a filter circuit, and a power estimation circuit. The frequency adjustment circuit is configured to receive a two-tone signal from a signal generator and to generate a first signal according to the two-tone signal, in which the signal generator generates the two-tone signal according to a first coefficient and a second coefficient. The filter circuit is configured to filter the first signal, in order to generate a second signal. The power estimation circuit is configured to detect a power of an intermodulation distortion from the third order (IMD3) signal component, which is associated with the two-tone signal, in the second signal, and to adjust at least one of the first coefficient and the second coefficient according to the power, in order to reduce the power.

In some embodiments, a signal adjustment method includes the following operations: receiving a two-tone signal from a signal generator and generating a first signal according to the two-tone signal, in which the signal generator generates the two-tone signal according to a first coefficient and a second coefficient; filtering the first signal, in order to generate a second signal; and detecting a power of an IMD3 signal component, which is associated with the two-tone signal, in the second signal, and adjusting at least one of the first coefficient and the second coefficient according to the power, in order to reduce the power.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
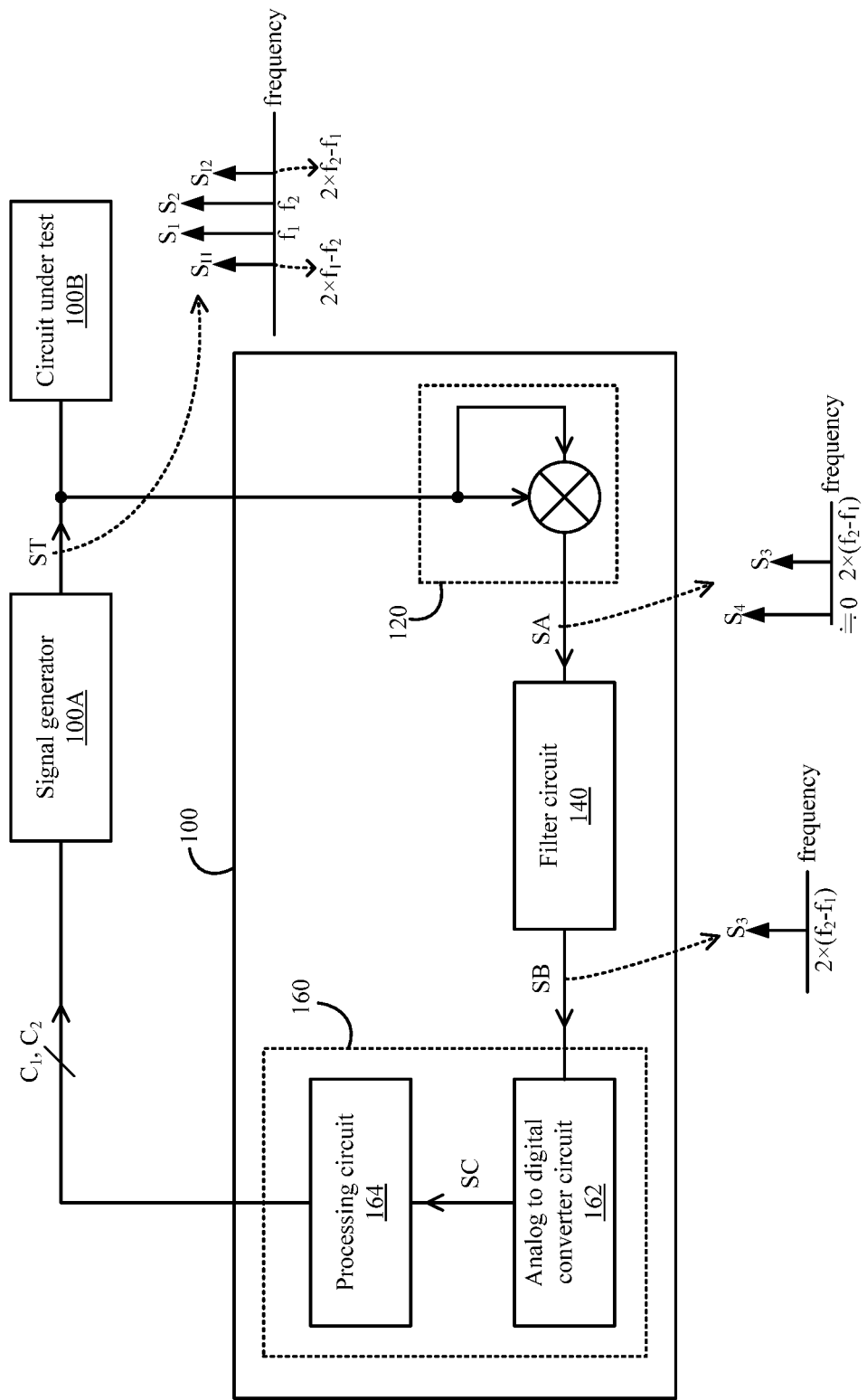
FIG. 1 is a schematic diagram of a signal adjustment device according to some embodiments of the present disclosure.

FIG. 1 is a schematic diagram of a signal adjustment device 100 according to some embodiments of the present disclosure. In some embodiments, the signal adjustment device 100 is to calibrate a signal (which may be, for example, a two-tone signal ST) generated from the signal generator 100A, in order to improve the linearity of the signal. As a result, the calibrated signal can be employed to test a circuit under test 100B, in order to acquire a more accurate testing result. In some embodiments, the signal adjustment device 100 is an external device independent to the circuit under test 100B. In some embodiments, the signal adjustment device 100 may be integrated in the circuit under test 100B. For example, the circuit under test 100B is a chip, and the signal adjustment device 100 is a part of a testing circuit in the chip. The above applications of the signal adjustment device 100 are given for illustrative purposes, and the present disclosure is not limited thereto.

The signal adjustment device 100 includes a frequency adjustment circuit 120, a filter circuit 140, and a power estimation circuit 160. In some embodiments, the signal generator 100A may an arbitrary waveform generator, which is able to generate the two-tone signal ST according to data (e.g., equation 2 as discussed below) inputted from a user or an external device. In some embodiments, the two-tone signal ST is for testing linearity of the circuit under test 100B. Compared with a single-tone signal, by using the two-tone signal ST, a more accurate testing result can be obtained. The frequency adjustment circuit 120 receives the two-tone signal ST from the signal generator 100A, and generates a signal SA according to the two-tone signal ST.

In some embodiments, the two-tone signal ST mainly includes a signal component $S_1$ having a frequency $f_1$ and a signal component $S_2$ having a frequency $f_2$. If the signal generator 100A is non-linear, based on a non-linear model (e.g., equation 3 as discussed below), the two-tone signal ST further includes an intermodulation distortion from the third order (IMD3) signal component $S_{f1}$ and an IMD3 signal component $S_{f2}$, in which a frequency of the IMD3 signal component $S_{f1}$ is $2 \times f_2 - f_1$ and a frequency of the IMD3 signal component $S_{f1}$ is $2 \times f_1 - f_2$. In some cases, if the power of the IMD3 signal component $S_{f1}$ and that of the IMD3 signal component $S_{f1}$ are too high, the linearity of the two-tone signal ST will be decreased, and thus the two-tone signal ST is insufficient to be a testing signal. To prevent such cases, in some embodiments, the power estimation circuit 160 may adjust at least one of a coefficient $C_1$ and a coefficient $C_2$ in response to the power of the IMD3 signal component $S_{f2}$ (or the IMD3 signal component $S_{f1}$), in order to reduce the power of both of the IMD3 signal component $S_{f1}$ and the IMD3 signal component $S_{f2}$. As a result, the linearity of the two-tone signal ST can be improved to acquire more accurate test result.

In some embodiments, the frequency adjustment circuit 120 is configured to down convert the two-tone signal ST (i.e. decrease the frequency of the two-tone signal ST), in order to generate the signal SA. For example, the frequency adjustment circuit 120 may be a self-mixer circuit, which may modulate the two-tone signal ST according to the two-tone signal ST to generate the signal SA. In the two-tone signal ST, a frequency of the IMD3 signal component $S_{f1}$ may be expressed as $f_1 - (f_2 - f_1)$, and the frequency of the IMD3 signal component $S_{f2}$ may be expressed as $f_2 + (f_2 - f_1)$, in which the $f_2 - f_1$ is a frequency offset between the signal component $S_2$ and the signal component $S_1$. In other words, a frequency of each of the IMD3 signal component $S_{f1}$ and the IMD3 signal component $S_{f2}$ has a positive correlation with an absolute frequency of the two-tone signal ST (i.e., the frequency $f_1$ or the frequency $f_2$) and the frequency offset. With operations of the frequency adjustment circuit 120, the IMD3 signal component $S_{f1}$ is down converted to be the IMD3 signal component $S_3$ in the signal SA. The IMD3 signal component $S_3$ has a frequency of $2 \times (f_2 - f_1)$ that only has the positive correlation with the frequency offset and is not correlated with the absolute frequency. If the power of the IMD3 signal component $S_{f2}$ (or the IMD3 signal component $S_{f1}$) in the two-tone signal ST is directly detected, subsequent circuit(s) (which may be, for example, the analog to digital converter circuit 162) is required to have higher sampling rate, which is not easy for hardware implementation. In some embodiments, by detecting the power of the IMD3 signal component $S_3$ which has been down converted, the sampling rate of the subsequent circuit(s) can be lower.

For example, if the frequency $f_1$ is 10 megahertz (MHz) and the frequency $f_2$ is 12 MHz, and the frequency of the IMD3 signal component $S_{f2}$ and that of the IMD3 signal component $S_{f1}$ are 14 MHz and 8 MHz respectively. After being processed by the frequency adjustment circuit 120, the frequency of the IMD3 signal component $S_3$, which is associated with the two-tone signal ST, in the signal SA is 4 MHz. As a result, the sampling rate of the subsequent circuit can be lower, which is easier for hardware implementation. In some other embodiments, the frequency adjustment circuit 120 may be implemented with an envelope detector circuit.

The filter circuit 140 is configured to filter the signal SA to generate a signal SB. In some cases, the signal SA may have higher DC offset due to operations of the frequency adjustment circuit 120, which results in a saturation of subsequent circuit(s) (which may be, for example, the analog to digital converter circuit 162). In order to prevent such saturation, the filter circuit 140 may filter out at least one signal component $S_4$ (which equals to the DC offset) having a frequency close to the DC frequency (i.e., 0 Hz) in the signal SA, in order to generate the signal SB. In some embodiments, the signal SA may have additional signal component(s) having other frequency due to operations of the frequency adjustment circuit 120. In other words, the frequency of the at least one signal component $S_4$ may further have an additional signal component, in which the frequency of the additional signal component may be lower than or equal to the frequency offset $f_2 - f_1$. In some embodiments, the filter circuit 140 may be implemented with a high pass filter circuit or a band pass filter circuit.

The power estimation circuit 160 is configured to detect power of the IMD3 signal component $S_3$, which is associated with the two-tone signal ST, in the signal SB, and to adjust at least one of the coefficient $C_1$ and the coefficient $C_2$ according to the power of the IMD3 signal component $S_3$. In some embodiments, the power estimation circuit 160 includes the analog to digital converter circuit 162 and a processing circuit 164. The analog to digital converter circuit 162 is configured to convert the IMD3 signal component $S_3$ to be a digital code SC. The processing circuit 164 obtains the power of the IMD3 signal component $S_3$ according to the digital code SC, and adjusts at least one of the coefficient $C_1$ and the coefficient $C_2$ according to the IMD3 signal component $S_3$, in order to lower the power of the IMD3 signal component $S_3$ (i.e., lowering the power of the IMD3 signal component $S_{f1}$ and that of the IMD3 signal component $S_{f2}$). In some embodiments, the processing circuit 164 may be a digital signal processor circuit including one or more digital logic circuits, which are configured to perform operations in FIG. 3 in order to adjust at least one of the coefficient $C_1$ and the coefficient $C_2$.

Reference is made to the following document, K. Kato, F. Abe, K. Wakabayashi, T. Yamada, H. Kobayashi, O. Kobayashi, K. Niitsu "Low-IMD Two-Tone Signal Generation for ADC Testing", IEEE International Mixed-Signals, Sensors, and Systems Test Workshop, Taipei, Taiwan (May 2012), and the two-tone signal ST can be expressed as following equation 1:

$$ST = x(n) = \begin{cases} x_1(n), n \text{ is odd number} \\ x_2(n), n \text{ is even number} \end{cases} \quad 1$$

In some embodiments, with further reference to the above document, $x_1(n)$ and $x_2(n)$ in equation 1 can be re-written as the following equation 2:

$$\begin{cases} x_1(n) = A\cos[2\pi f_1(n-1)T_S] + A\cos[2\pi f_2(n-1)T_S] \\ x_2(n) = A\cos(2\pi f_1 nTs + \pi/C_1) + A\cos(2\pi f_2 nTs - \pi/C_2) \end{cases} \quad 2$$

in which $T_S$ is a sampling period of the signal generator 100A, functions associated with the frequency $f_1$ are for defining the signal component $S_1$, functions associated with the frequency $f_2$ are for defining the signal component $S_2$, A is an amplitude of each of the signal component $S_1$ and the signal component $S_2$, the coefficient $C_1$ is configured to set a phase of the signal component $S_1$, and the coefficient $C_2$ is configured to set a phase of the signal component $S_2$. In some embodiments, an initial value of the coefficient $C_1$ and that of the coefficient $C_2$ may be set to be 3, but the present disclosure is not limited thereto. In some embodiments, a user may input the above equation 2 to the signal generator 100A, such that the signal generator 100A may generate the two-tone signal ST according to the coefficient $C_1$ and the coefficient $C_2$.

In order to improve the linearity, the above document configures two signal components in the two-tone signal to have fixed phases. However, in practical applications, such configuration is not able to eliminate impacts of the IMD3 signal components completely. Compared with the above document, in some embodiments of the present disclosure, by detecting the IMD3 signal component $S_3$ to adjust the coefficient $C_1$ and/or the coefficient $C_2$, it is able to reduce the power of the IMD3 signal components $S_{f1}$ and $S_{f2}$ according to practical application environment, in order to achieve better linearity.

Figure 2:
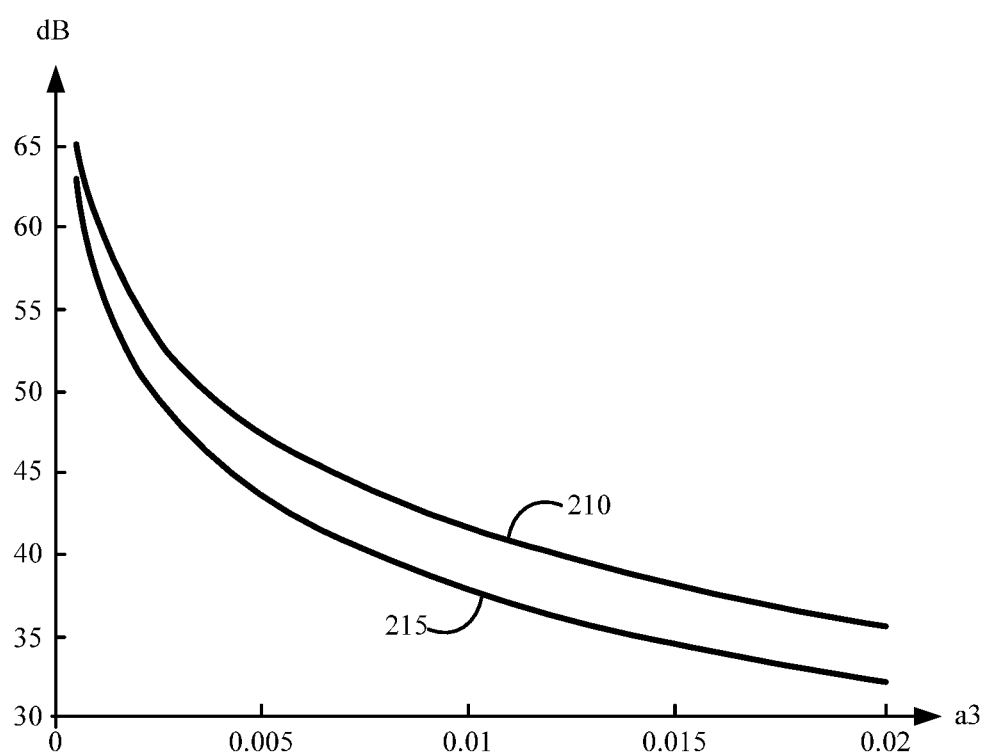
FIG. 2 is a schematic diagram illustrating trends of an intermodulation distortion from the third order (IMD3) signal components in FIG. 1 according to some embodiments of the present disclosure.

FIG. 2 is a schematic diagram illustrating a trend of the IMD3 signal component $S_{f2}$ and that of the IMD3 signal component $S_3$ in FIG. 1 according to some embodiments of the present disclosure. If the signal generator 100A is non-linear, a non-linear model of the signal generator 100A can be expressed as the following equation 3:

$$ST = a1 \cdot x(n) + a3 \cdot x(n)^3 \qquad 3$$

in which a1 is a coefficient of the first order term and a3 is a coefficient of the third order term. The IMD3 signal components are associated with the third order term. In an experimental example, as shown in FIG. 2, when the coefficient a3 varies, the trend of the IMD3 signal component $S_{f2}$ (i.e., curve 210) is similar to the trend of the IMD3 signal component $S_3$ (i.e., curve 215). In other words, when adjusting the coefficient $C_1$ and the coefficient $C_2$, it is able to determine whether the linearity of the two-tone signal ST is improved by detecting the power of the IMD3 signal component $S_3$ (instead of directly detecting the power of the IMD3 signal component $S_{f2}$). As mentioned above, with such detection, the sampling rate can be lower for ease of hardware implementation.

Figure 3:
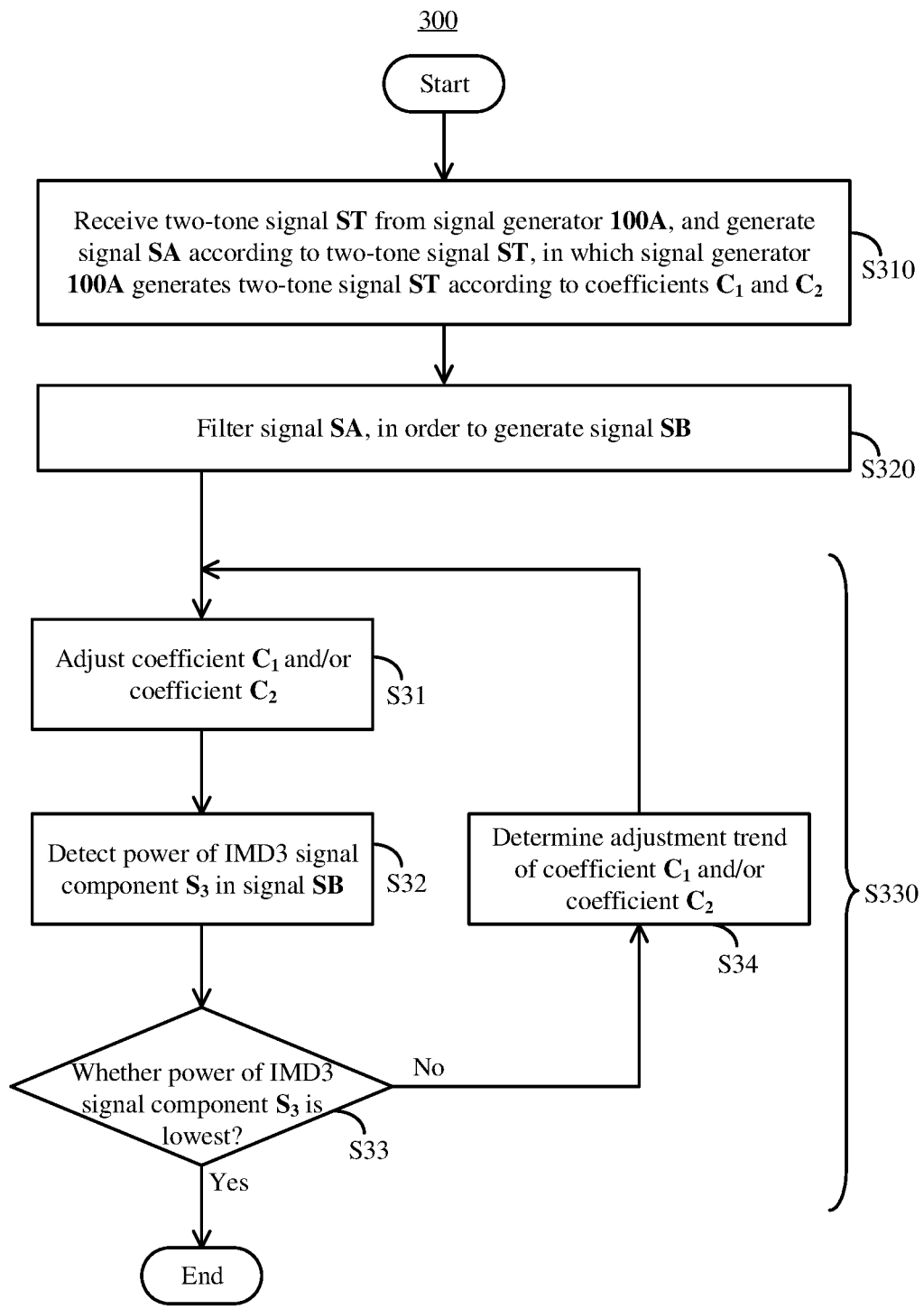
FIG. 3 is a flow chart of a signal adjustment method according to some embodiments of the present disclosure.

FIG. 3 is a flow chart of a signal adjustment method 300 according to some embodiments of the present disclosure. In operation S310, the two-tone signal ST is received from the signal generator 100A, and the signal SA is generated according to the two-tone signal ST, in which the signal generator 100A generates the two-tone signal ST according to the coefficient $C_1$ and the coefficient $C_2$. In operation S320, the signal SA is filtered to generate the signal SB. In operation S330, the power of the IMD3 signal component $S_3$, which is associated with the two-tone signal ST, in the signal SB is detected, and the coefficient $C_1$ and the coefficient $C_2$ are adjusted according to the power of the IMD3 signal component $S_3$, in order to reduce of the power of the IMD3 signal component $S_3$.

In greater detail, operation S330 includes steps S31-S34. In step S31, the coefficient $C_1$ and/or the coefficient $C_2$ are adjusted. In step S32, the power of the IMD3 signal component $S_3$ in the signal SB is detected. In step S33, whether the power of the IMD3 signal component $S_3$ is lowest is determined. If the power is lowest, the signal adjustment method 300 is completed. If the power is not lowest, step S34 is performed. In step S34, the adjustment trend of the coefficient $C_1$ and/or the coefficient $C_2$ is determined.

For example, in an initial operation, the power estimation circuit 160 may set the coefficient $C_1$ and the coefficient $C_2$ to be initial values, and records the power of the IMD3 signal component $S_3$. Afterwards, the power estimation circuit 160 keeps the coefficient $C_1$ being fixed and increases the coefficient $C_2$ (i.e., step S31), and determines whether the adjusted power of the IMD3 signal component $S_3$ is lower than the previous power of the IMD3 signal component $S_3$ (i.e., step S32 and step S33). If the adjusted power is lower than the previous power, the power estimation circuit 160 may further increase the coefficient $C_2$ (i.e., step S34 and step S31), and repeats performing step S32 and step 33, in order to find lowest power of the IMD3 signal component $S_3$. Alternatively, if the adjusted power of the IMD3 signal component $S_3$ is not lower than the previous power, the power estimation circuit 160 switches to keep the coefficient $C_1$ being fixed and to decrease the coefficient $C_2$ (i.e., step S34 and step S31), and determines whether the adjusted power of the IMD3 signal component $S_3$ is lower than the previous power (i.e., step S32 and step S33), in order to find the lowest power of the IMD3 signal component $S_3$. By recording the power of the IMD3 signal component $S_3$ corresponding to multiple combinations of the coefficient $C_1$ and the coefficient $C_2$, the power estimation circuit 160 is able to output the coefficient $C_1$ and the coefficient $C_2$ that able to minimize the power of the IMD3 signal component $S_3$. Based on steps S31-S34, it can be understood that, in some embodiments, the power estimation circuit 160 in FIG. 1 is able to adjust at least one of the coefficients $C_1$ and $C_2$ recursively, in order to minimize the power of the IMD3 signal component $S_3$.

The above descriptions are given with examples of adjusting the coefficient $C_2$ for illustrative purposes, but the present disclosure is not limited thereto. In some embodiments, in order to find the lowest power, the power estimation circuit 160 may keep the value the coefficient $C_2$ being fixed after the coefficient $C_2$ is adjusted, and starts adjusting the coefficient $C_1$ with the same steps. In some embodiments, in step S31, the power estimation circuit 160 may adjust both of the coefficient $C_1$ and the coefficient $C_2$, or only adjust one of the coefficient $C_1$ and the coefficient $C_2$.

The above description of the signal adjustment method 300 includes exemplary operations, but the operations of the signal adjustment method 300 are not necessarily performed in the order described above. Operations of the signal adjustment method 300 can be added, replaced, changed order, and/or eliminated, or the operations of the signal adjustment method 300 can be executed simultaneously or partially simultaneously as appropriate, in accordance with the spirit and scope of various embodiments of the present disclosure.

In an experimental example, compared with the document that utilizes fixed phase(s), the linearity of the two-tone signal ST is improved by more than 9.52 dB with the adjustment of the signal adjustment method 300.

As described above, with the signal adjustment device and the signal adjustment method provided in some embodiments of the present disclosure, the IMD3 signal component can be detected by using circuit(s) having lower sampling rate, and the coefficient(s) inputted to the signal generator can be adjusted dynamically, in order to improve the linearity of output signal(s) from the signal generator.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A signal adjustment device, comprising:
   a frequency adjustment circuit configured to receive a two-tone signal from a signal generator and to generate a first signal according to the two-tone signal, wherein the signal generator generates the two-tone signal according to a first coefficient and a second coefficient;
   a filter circuit configured to filter the first signal, in order to generate a second signal; and
   a power estimation circuit configured to detect a power of an intermodulation distortion from a third order (IMD3) signal component, which is associated with the two-tone signal, in the second signal, and to adjust at least one of the first coefficient and the second coefficient according to the power, in order to reduce the power,
   wherein the two-tone signal comprises a first signal component and a second signal component, the first signal component or the second signal component has an absolute frequency, and a frequency of the IMD3 signal component is not correlated with the absolute frequency.

2. The signal adjustment device of claim 1, wherein the frequency adjustment circuit is configured to down convert the two-tone signal, in order to generate the first signal.

3. The signal adjustment device of claim 1, wherein the frequency adjustment circuit is a self-mixer circuit.

4. The signal adjustment device of claim 1, wherein the filter circuit is configured to filter out at least one signal component having a frequency close to a DC frequency in the first signal, in order to generate the second signal.

5. The signal adjustment device of claim 1, wherein the first coefficient is configured to set a phase of the first signal component, and the second coefficient is configured to set a phase of the second signal component.

6. The signal adjustment device of claim 1, wherein the first signal component and the second signal component have a frequency offset, and the frequency of the IMD3 signal component has a positive correlation with the frequency offset.

7. The signal adjustment device of claim 1, wherein the power estimation circuit is configured to adjust the first coefficient and the second coefficient recursively, in order to minimize the power of the IMD3 signal component.

8. A signal adjustment method, comprising:
   receiving a two-tone signal from a signal generator and generating a first signal according to the two-tone signal, wherein the signal generator generates the two-tone signal according to a first coefficient and a second coefficient;
   filtering the first signal, in order to generate a second signal; and
   detecting a power of an intermodulation distortion from a third order (IMD3) signal component, which is associated with the two-tone signal, in the second signal, and adjusting at least one of the first coefficient and the second coefficient according to the power, in order to reduce the power,
   wherein the two-tone signal comprises a first signal component, a second signal component, the first signal component and the second signal component have a frequency offset, and a frequency of the IMD3 signal component is twice the frequency offset.

9. The signal adjustment method of claim 8, wherein receiving the two-tone signal from the signal generator and generating the first signal according to the two-tone signal comprises:
   down converting the two-tone signal, in order to generate the first signal.

10. The signal adjustment method of claim 8, wherein receiving the two-tone signal from the signal generator and generating the first signal according to the two-tone signal comprises:
    modulating, by a self-mixer circuit, the two-tone signal according to the two-tone signal, in order to generate the first signal.

11. The signal adjustment method of claim 8, wherein filtering the first signal, in order to generate the second signal comprises:
    filtering out at least one signal component having a frequency close to a DC frequency in the first signal, in order to generate the second signal.

12. The signal adjustment method of claim 8, wherein the first coefficient is configured to set a phase of the first signal component, and the second coefficient is configured to set a phase of the second signal component.

13. The signal adjustment method of claim 8, wherein the frequency of the IMD3 signal component has a positive correlation with the frequency offset.

14. The signal adjustment method of claim 8, wherein the first signal component or the second signal component has an absolute frequency, and the frequency of the IMD3 signal component is not correlated with the absolute frequency.

15. The signal adjustment method of claim 8, wherein detecting the power and adjusting the at least one of the first coefficient and the second coefficient according to the power, in order to reduce the power comprises:
    adjusting the at least one of the first coefficient and the second coefficient recursively, in order to minimize the power of the IMD3 signal component.

16. A signal adjustment method, comprising:
    receiving a two-tone signal from a signal generator and generating a first signal according to the two-tone signal, wherein the signal generator generates the two-tone signal according to a first coefficient and a second coefficient;
    filtering the first signal, in order to generate a second signal; and
    detecting a power of an intermodulation distortion from a third order (IMD3) signal component, which is associated with the two-tone signal, in the second signal, and adjusting at least one of the first coefficient and the second coefficient according to the power, in order to reduce the power, wherein the two-tone signal comprises a first signal component and a second signal component, the first signal component or the second signal component has an absolute frequency, and a frequency of the IMD3 signal component is not correlated with the absolute frequency.

17. The signal adjustment method of claim 16, wherein receiving the two-tone signal from the signal generator and generating the first signal according to the two-tone signal comprises:

modulating, by a self-mixer circuit, the two-tone signal according to the two-tone signal, in order to generate the first signal.

18. The signal adjustment method of claim 16, wherein filtering the first signal, in order to generate the second signal comprises:

filtering out at least one signal component having a frequency close to a DC frequency in the first signal, in order to generate the second signal.

19. The signal adjustment method of claim 16, wherein the first coefficient is configured to set a phase of the first signal component, and the second coefficient is configured to set a phase of the second signal component.

20. The signal adjustment method of claim 16, wherein detecting the power and adjusting the at least one of the first coefficient and the second coefficient according to the power, in order to reduce the power comprises:

adjusting the at least one of the first coefficient and the second coefficient recursively, in order to minimize the power of the IMD3 signal component.

* * * * *